United States Patent
Bour et al.

(10) Patent No.: US 9,093,395 B2
(45) Date of Patent: Jul. 28, 2015

(54) METHOD AND SYSTEM FOR LOCAL CONTROL OF DEFECT DENSITY IN GALLIUM NITRIDE BASED ELECTRONICS

(75) Inventors: David P. Bour, Cupertino, CA (US); Linda Romano, Sunnyvale, CA (US); Thomas R. Prunty, Santa Clara, CA (US); Isik C. Kizilyalli, San Francisco, CA (US); Hui Nie, Cupertino, CA (US); Andrew P. Edwards, San Jose, CA (US); Richard J. Brown, Los Gatos, CA (US)

(73) Assignee: Avogy, Inc., San Jose, CA (US)

( * ) Notice: Subject to any disclaimer, the term of this patent is extended or adjusted under 35 U.S.C. 154(b) by 501 days.

(21) Appl. No.: 13/225,345

(22) Filed: Sep. 2, 2011

(65) Prior Publication Data
US 2013/0056743 A1    Mar. 7, 2013

(51) Int. Cl.
| | | |
|---|---|---|
| H01L 29/20 | (2006.01) | |
| H01L 21/302 | (2006.01) | |
| H01L 29/32 | (2006.01) | |
| H01L 29/66 | (2006.01) | |
| H01L 29/808 | (2006.01) | |
| H01L 29/861 | (2006.01) | |
| H01L 29/872 | (2006.01) | |

(52) U.S. Cl.
CPC ............ *H01L 29/32* (2013.01); *H01L 29/6609* (2013.01); *H01L 29/66143* (2013.01); *H01L 29/66212* (2013.01); *H01L 29/66446* (2013.01); *H01L 29/8083* (2013.01); *H01L 29/861* (2013.01); *H01L 29/872* (2013.01); *H01L 29/2003* (2013.01)

(58) Field of Classification Search
CPC ..................... H01L 21/02647; H01L 29/8086; H01L 21/2018; H01L 21/8083
USPC .......... 257/330, 256, 135, 137, 329; 438/138, 438/347, 22, 34; 117/84, 91
See application file for complete search history.

(56) References Cited

U.S. PATENT DOCUMENTS

| | | | | |
|---|---|---|---|---|
| 4,651,407 | A * | 3/1987 | Bencuya ....................... | 438/193 |
| 6,312,967 | B1 * | 11/2001 | Ikeda .............................. | 438/22 |
| 6,475,882 | B1 * | 11/2002 | Sakai et al. ................... | 438/483 |
| 6,809,351 | B2 * | 10/2004 | Kuramoto et al. ............ | 257/190 |
| 7,355,223 | B2 * | 4/2008 | Harris et al. ................... | 257/256 |
| 7,491,627 | B2 * | 2/2009 | Beach et al. .................. | 438/483 |
| 7,641,988 | B2 * | 1/2010 | Suzuki .......................... | 428/698 |
| 8,502,234 | B2 * | 8/2013 | Kizilyalli et al. .............. | 257/76 |
| 2002/0168844 | A1 * | 11/2002 | Kuramoto et al. ............ | 438/604 |

(Continued)

*Primary Examiner* — Bradley K Smith
*Assistant Examiner* — David Goodwin
(74) *Attorney, Agent, or Firm* — Kilpatrick Townsend & Stockton LLP (57) ABSTRACT

A diode includes a substrate characterized by a first dislocation density and a first conductivity type, a first contact coupled to the substrate, and a masking layer having a predetermined thickness and coupled to the semiconductor substrate. The masking layer comprises a plurality of continuous sections and a plurality of openings exposing the substrate and disposed between the continuous sections. The diode also includes an epitaxial layer greater than 5 μm thick coupled to the substrate and the masking layer. The epitaxial layer comprises a first set of regions overlying the plurality of openings and characterized by a second dislocation density and a second set of regions overlying the set of continuous sections and characterized by a third dislocation density less than the first dislocation density and the second dislocation density. The diode further includes a second contact coupled to the epitaxial layer.

23 Claims, 5 Drawing Sheets

(56) References Cited

U.S. PATENT DOCUMENTS

| | | | |
|---|---|---|---|
| 2003/0020061 A1* | 1/2003 | Emerson et al. | 257/14 |
| 2003/0037722 A1* | 2/2003 | Kiyoku et al. | 117/84 |
| 2005/0199882 A1* | 9/2005 | Sankin et al. | 257/77 |
| 2005/0232428 A1* | 10/2005 | Little et al. | 380/277 |
| 2006/0099781 A1* | 5/2006 | Beaumont et al. | 438/509 |
| 2008/0203471 A1* | 8/2008 | Otake et al. | 257/329 |
| 2008/0265259 A1* | 10/2008 | Gunter et al. | 257/76 |
| 2012/0161208 A1* | 6/2012 | Veliadis | 257/265 |
| 2013/0032811 A1 | 2/2013 | Kizilyalli et al. | |
| 2013/0032812 A1 | 2/2013 | Kizilyalli et al. | |
| 2013/0032813 A1 | 2/2013 | Kizilyalli et al. | |
| 2013/0114633 A1* | 5/2013 | Ito et al. | 372/44.011 |

\* cited by examiner

METHOD AND SYSTEM FOR LOCAL CONTROL OF DEFECT DENSITY IN GALLIUM NITRIDE BASED ELECTRONICS

BACKGROUND OF THE INVENTION

Power electronics are widely used in a variety of applications. Power electronic devices are commonly used in circuits to modify the form of electrical energy, for example, from ac to dc, from one voltage level to another, or in some other way. Such devices can operate over a wide range of power levels, from milliwatts in mobile devices to hundreds of megawatts in a high voltage power transmission system. Despite the progress made in power electronics, there is a need in the art for improved electronics systems and methods of operating the same.

SUMMARY OF THE INVENTION

The present invention relates generally to electronic devices. More specifically, the present invention relates to methods and systems for controlling defect density in semiconductor devices. Merely by way of example, the invention has been applied to methods and systems for locally controlling defect density in high voltage GaN devices with vertical current flow. The methods and techniques can be applied to a variety of compound semiconductor systems including diodes and transistors.

According to an embodiment of the present invention, a diode is provided. The diode includes a substrate characterized by a first dislocation density and a first conductivity type, a first contact coupled to the substrate, and a masking layer having a predetermined thickness and coupled to the semiconductor substrate. The masking layer includes a plurality of continuous sections and a plurality of openings exposing the substrate and disposed between the continuous sections. The diode also includes an epitaxial layer greater than 5 µm thick coupled to the substrate and the masking layer. The epitaxial layer includes a first set of regions overlying the plurality of openings and characterized by a second dislocation density and a second set of regions overlying the set of continuous sections and characterized by a third dislocation density less than the first dislocation density and the second dislocation density. The diode further includes a second contact coupled to the epitaxial layer.

According to another embodiment of the present invention, a vertical junction FET is provided. The vertical junction FET includes a substrate characterized by a first dislocation density and a first conductivity type, a first contact coupled to the substrate, and a masking layer having a predetermined thickness and coupled to the semiconductor substrate. The masking layer includes a plurality of continuous sections of the predetermined thickness and a plurality of openings exposing the substrate and disposed between the continuous sections. The vertical junction FET also includes an epitaxial layer coupled to the substrate and the masking layer. The epitaxial layer includes a first set of regions overlying the plurality of openings and characterized by a second dislocation density and a second set of regions overlying the set of continuous sections and characterized by a third dislocation density less than the first dislocation density and the second dislocation density. The vertical junction FET further includes a plurality of gate regions coupled to the epitaxial layer and defining one or more current flow channels, one or more second contacts coupled to the epitaxial layer, each of the one or more second contacts being adjacent one of the one or more current flow channels, and a plurality of third contacts, each of the plurality of third contacts being coupled to one of the plurality of gate regions.

According to a alternative embodiment of the present invention, a method of fabricating a semiconductor device is provided. The method includes providing a substrate and forming a masking layer coupled to the substrate. The masking layer includes continuous portions and openings exposing the substrate. The method also includes positioning the masked substrate in an epitaxial growth chamber and performing an epitaxial lateral overgrowth process to form a III-nitride epitaxial layer greater than 5 µm in thickness coupled to the substrate and the masking layer. The method further includes forming an electrical contact electrically connected to the substrate and forming an electrical contact electrically connected to the III-nitride epitaxial layer.

Numerous benefits are achieved by way of the present invention over conventional techniques. For example, embodiments of the present invention provide high quality epitaxial material suitable for high power electronic devices. Additionally, embodiments of the present invention enable device designers to position high field regions with respect to areas with locally reduced defect densities to optimize device performance. These and other embodiments of the invention along with many of its advantages and features are described in more detail in conjunction with the text below and attached figures.

DETAILED DESCRIPTION OF SPECIFIC EMBODIMENTS

Embodiments of the present invention relate to electronic devices. More specifically, the present invention relates to methods and systems for controlling defect density in semiconductor devices. Merely by way of example, the invention has been applied to methods and systems for locally controlling defect density in high voltage GaN devices with vertical current flow. The methods and techniques can be applied to a variety of compound semiconductor systems including diodes and transistors.

Structural defects limit the performance and reliability of GaN-based electronic devices. These characteristics may be improved by applying epitaxial lateral overgrowth (ELO) techniques to locally reduce the dislocation density. The device geometry should be adjusted to accommodate the dislocation distribution resulting from ELO. For example, stripe-shaped Schottky barrier diodes and p-n junction diodes may be registered to the underlying ELO mask, with an alignment that optimizes performance and reliability. Likewise, since vertical junction FETs are inherently stripe-shaped, they are well-suited to this approach. Using embodiments of the present invention, regions of high quality epitaxial material are provided with thicknesses suitable for high power electrical devices.

Figure 1:
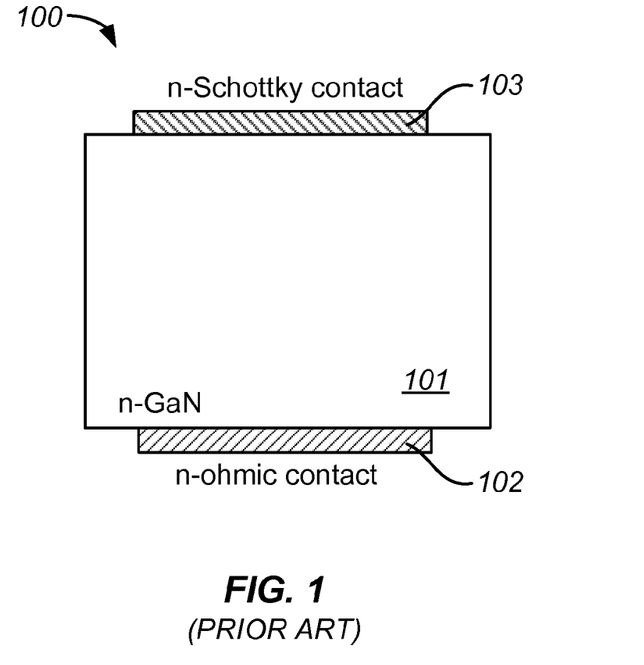
FIG. 1 is a simplified schematic diagram illustrating a conventional Schottky barrier diode.

FIG. 1 is a simplified schematic diagram illustrating a conventional Schottky barrier diode. The cross section illustrated in FIG. 1 shows a GaN Schottky barrier diode 100 with a lightly doped n-type GaN region 101 and an ohmic contact 102 connected to a first portion of the lightly doped n-type GaN region. A Schottky contact 103 is formed in contact with a second portion of the lightly doped n-type GaN region 101 to form a Schottky barrier diode. As will be evident to one of skill in the art, the Schottky diode passes current in one direction (i.e., the forward direction) with low resistance and can sustain high voltages in reverse bias with little to no current flow in the reverse direction.

Figure 2:
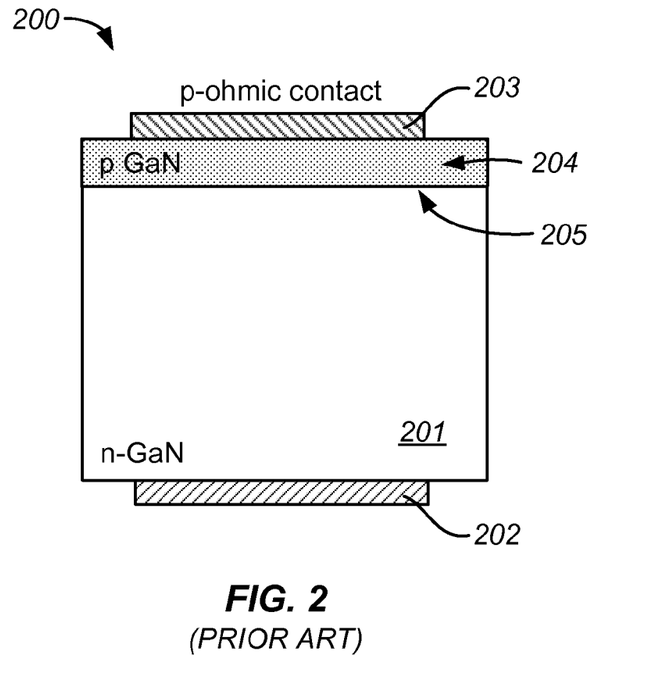
FIG. 2 is a simplified schematic diagram illustrating a conventional p-n junction diode.

FIG. 2 is a simplified schematic diagram illustrating a conventional p-n junction diode. The cross section illustrated in FIG. 2 shows a GaN p-n junction diode 200 with an n-type doped GaN region 201 and an ohmic contact 202 connected to the n-type doped GaN region. The p-n junction diode 200 also includes a p-type doped GaN region 204 and an ohmic contact 203 connected to the p-type doped GaN region. The p-type doped GaN region 204 is typically a GaN layer that is epitaxially deposited over the n-type-doped GaN region 201. A p-n junction 205 is formed between the n-type and p-type regions. The rectifying behavior of the p-n junction diode is a consequence of the presence of the p-n junction 205.

Figure 3:
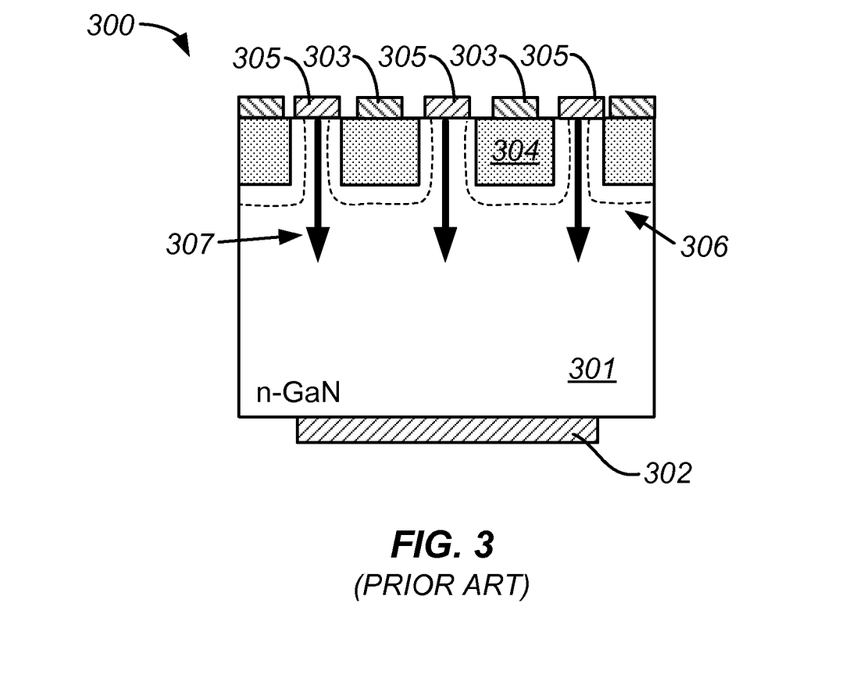
FIG. 3 is a simplified schematic diagram illustrating a conventional vertical junction field effect transistor.

FIG. 3 is a simplified schematic diagram illustrating a conventional vertical junction field effect transistor (JFET) 300. The illustrated vertical JFET is useful for high-power switching applications among other uses. The GaN vertical JFET includes an n-type-doped GaN substrate 301 and an ohmic contact 302 electrically connected to the n-type-doped GaN substrate. A plurality of p-type doped GaN regions 304 are provided in contact with GaN substrate and are used as gate regions as described more fully below. Thus, the vertical JFET includes an array of lateral p-n junctions formed in GaN at locations between and below the p-type doped GaN regions 304. In the illustrated embodiment, the p-type GaN regions 304 are embedded in the n-type GaN substrate 301 as stripes extending into the plane of the figure. The p-type GaN regions 304 can be formed by etch and regrowth processes, diffusion of an acceptor species into the n-type GaN substrate, or the like. Each p-type GaN region 304 has an ohmic contact electrode 303. In order to provide a third terminal, ohmic contacts 305 are also formed in electrical contact with the n-type GaN material at locations interspersed between the p-type GaN regions. Thus electrodes 302, 303, and 305 are provided for the source ohmic contact, gate contact, and drain ohmic contact, respectively, of the three terminal vertical JFET.

As illustrated in FIG. 3, the edge of depletion regions 306 associated with the lateral p-n junctions is shown as separated, allowing current 307 to flow through the vertical channels between adjacent p-type GaN regions 304 when the device is in the "on" state. By applying a bias between the n-contacts 305 and the broad-area n-type contact 302, current 307 flows in the vertical channels disposed between each p-type GaN region 304. Because GaN is characterized by excellent electron mobility and thermal conductivity, the magnitude of the current may be large, providing benefits for high power operation. The vertical current flow 307 can be modulated by increasing and decreasing the channel width between the lateral p-n junctions in response to the bias applied to the p-type electrodes 303 (i.e., gates) with respect to the n-type electrodes 305 (drains). Specifically, as reverse bias is applied across the lateral junctions, the depletion region 306 may be modulated. For a sufficient reverse bias, the vertical current flow 307 may be decreased to zero as the channel is pinched off (i.e., the depletion regions 306 from adjacent lateral p-n junctions are touching, reducing the number of available free carriers towards zero). Additional description related to vertical JFETs is provided in U.S. patent application Ser. Nos. 13/198,655 and 13/198,659, both filed on Aug. 4, 2011, the disclosures of which are hereby incorporated by reference in their entirety.

Figure 4:
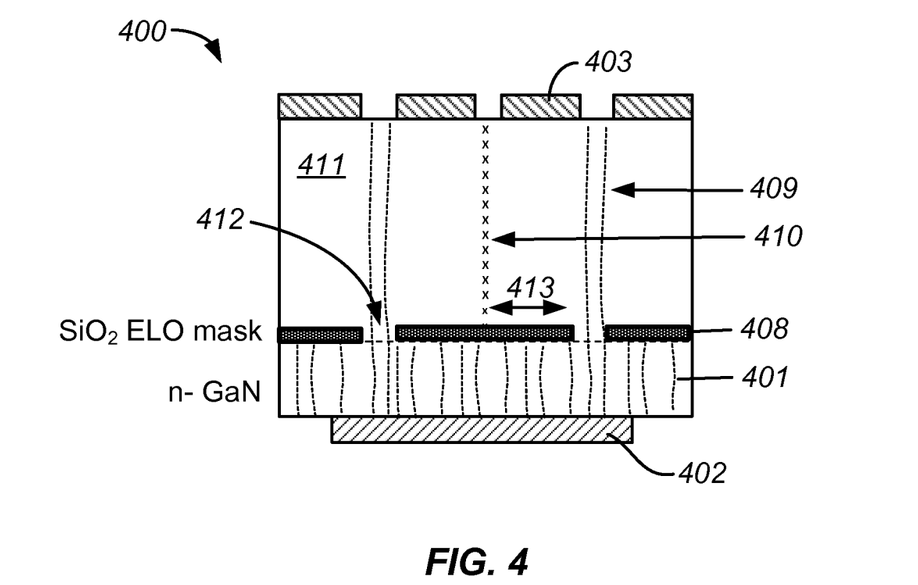
FIG. 4 is a simplified schematic diagram illustrating a Schottky barrier diode with reduced defects according to an embodiment of the present invention.

FIG. 4 is a simplified schematic diagram illustrating a Schottky barrier diode with reduced defects according to an embodiment of the present invention. As illustrated in FIG. 4, the Schottky barrier diode 400 (with an array of contacts on the Schottky contact side) utilizes an epitaxial lateral overgrowth (ELO or ELOG) technique to provide portions of the structure with a reduced defect density. Structures described herein may include a reduced threading dislocation density (TDD) as well as other types of crystallographic defects.

The Schottky barrier diode 400 includes an n-type GaN region 401 with an ohmic contact 402 connected to the n-type GaN region 401. A Schottky contact 403 is formed in an array configuration and electrically connected to the n-type GaN region, which may be lightly doped.

In order to improve the performance and reliability of the Schottky barrier diode 400 (although the techniques described herein are applicable to a wide variety of GaN-based electronic and optoelectronic devices), an ELO technique is utilized to locally lower the TDD. Epitaxial growth using the stripe-patterned ELO masks can reduce the dislocation density by approximately a factor of 100 or more in portions of the epitaxial layer disposed above the ELO mask 408. Referring to FIG. 4, narrow stripe regions with a width 413 (approximately half of the mask width) are characterized by reduced defect densities. The width of the ELO mask stripes, and consequently, the width 413 are selected depending on the particular application.

Referring to FIG. 4, the ELO process involves deposition of stripe-shaped dielectric masks 408 deposited over the surface of n-type GaN 401. In the illustrated embodiment, the dielectric ELO mask comprises $SiO_2$, but other dielectrics including $Si_3N_4$ and SiON can be utilized. As an example, the masks 408 can be 100 nm-200 nm thick $SiO_2$ films that are patterned into stripes of the desired width and orientation. A GaN epitaxial layer 411 is then grown selectively over these stripe masks. At the beginning of growth, GaN is deposited only in the windows 412 where the underlying GaN substrate 401 is exposed. GaN does not nucleate on the mask 408, providing for selective deposition of the GaN epitaxial layer. Over the mask, the growth is initially lateral. The epitaxially grown layer 411 includes threading dislocations 409 that propagate from the window regions 412 and extend through the epitaxial material to the surface, where they are disposed between adjacent contacts 403. The ELO process effectively filters the threading dislocations 409 since they cannot propagate into portions of the GaN layer 411 overlying the mask 408. Over the center of the mask, the growth fronts seeded by the adjacent windows meet and coalesce at coalescence boundary 410. The coalescence boundary 410 is typically highly defective. The GaN epitaxial layer 411 can consist of multiple epitaxial layers of varying constituent mole fraction, doping density, or the like. Thus, the term epitaxial layer can be understood as an epitaxial structure including multiple epitaxial layers. One of ordinary skill in the art would recognize many variations, modifications, and alternatives.

After coalescence and planarization of the GaN epitaxial layer 411, the TDD has been greatly reduced by the filtering action of the mask. Referring to FIG. 4, the ELO process provides regions (i.e., material with the width 413) of the epitaxially grown layer 411 between the threading dislocations 409 and the coalescence boundary 410 that are characterized by a reduced defect density (e.g., reduced TDD). The width of the low TDD region 413 is roughly half that of the mask width. Utilizing embodiments of the present invention, it is possible to reduce the dislocation density in GaN-based materials from densities in the range of $1 \times 10^6$ cm$^{-2}$ (a dislocation density characteristic of bulk GaN substrates) to densities of less than $1 \times 10^5$ cm$^{-2}$, less than $1 \times 10^4$ cm$^{-2}$, less than $1 \times 10^3$ cm$^{-2}$, or the like.

In some embodiments, the ELO mask 408 has a width ranging from about 5 μm to about 50 μm, for example, 10 μm and the spacing between the mask elements ranges from about 1 μm to about 5 μm, for example, 2 μm. Using these mask dimensions, regions of low TDD about 5 μm wide are formed. Referring to FIG. 4, the Schottky barrier diode contact 403 is positioned to overlap with the regions of low TDD, resulting in improved device performance and reliability. Embodiments of the present invention are not limited to these particular dimensions and may vary. As an example, as the epitaxial layer 411 increases in thickness, wider ELO masks can be utilized while still obtaining coalescence and planarization. Thus, for very thick devices, ELO masks with widths up to 100 μm or more may be utilized. It should be noted that as mask width increases, deposition on the mask may impact the desired selective deposition in the windows and may result in limits on mask width. One of ordinary skill in the art would recognize many variations, modifications, and alternatives.

Figure 5:
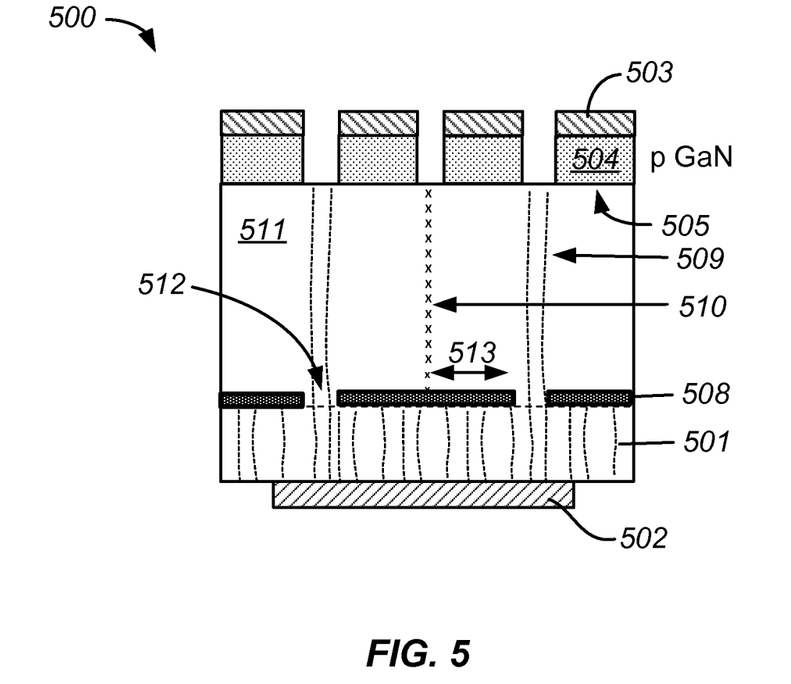
FIG. 5 is a simplified schematic diagram illustrating a p-n junction diode with reduced defects according to an embodiment of the present invention.

As described more fully throughout the present specification, the dislocation density is reduced locally (e.g., over a lateral scale of a few to tens of microns) to provide devices in which the electrical components including contacts are designed to take advantage of the locally lowered dislocation densities and thereby resulting in improvements in performance and reliability. A wide variety of GaN-based electronic devices can benefit from embodiments of the present invention. The techniques described herein are particularly applicable to vertical JFETs because of their inherent stripe geometry, but are also applicable to other device structures that are normally fabricated as broad-area devices, such as a Schottky diode as illustrated in FIG. 4 and a p-n junction diode as illustrated in FIG. 5. As illustrated in these figures, the Schottky contacts 403 and the p-n junctions 505 are formed as stripe arrays that are registered to the underlying ELO stripe masks 408 and 508, respectively. Alignment of the contacts to the ELO mask is facilitated by the high transmission of optical wavelengths through GaN-based materials.

The dislocation distribution produced in the ELO process can be characterized as follows. The dislocation density is greatly lowered at regions positioned over the mask 408 by the filtering action of the mask. This region with reduced TDD may be maximized by using large ELO stripe widths. Dislocations present in the initial epitaxial layer 401 may still thread vertically through the window (nucleation) regions 412 between the masks 408 as illustrated by threading dislocations 409. The area associated with the threading dislocations 409 may be minimized by reducing the width of the windows 412. There is a region of high dislocation density and collection of anti-phase boundaries over the center of each stripe associated with the coalescence boundary 410 associated with lateral growth domains that are not necessarily coherent.

Although some embodiments are discussed in terms of GaN substrates and GaN epitaxial layers, the present invention is not limited to these particular binary III-V materials and is applicable to a broader class of III-V materials, in particular III-nitride materials. Thus, although some examples relate to the growth of n-type GaN epitaxial layer(s) (e.g., doped with silicon), in other embodiments the techniques described herein are applicable to the growth of highly or lightly doped material, p-type material, material doped with dopants in addition to or other than silicon such as Ge, Se, S, O, Te, and the like. Additionally, other III-nitride materials in addition to GaN are included within the scope of the present invention, including, but not limited to, other binary III-nitride materials, ternary III-nitride materials, such as InGaN and AlGaN, quaternary III-nitride materials, such as AlInGaN, doped versions of these materials, and the like. The substrates discussed herein can include a single material system or multiple material systems including composite structures of multiple layers. Thus, although n-GaN substrate 401 is illustrated as a substrate, it can be an epitaxial layer deposited on a substrate such as sapphire, a portion of an epitaxial layer, or the like. One of ordinary skill in the art would recognize many variations, modifications, and alternatives.

Embodiments of the present invention utilize a larger area of the epitaxial structure for device operation than used in optical devices. As an example, multiple parallel diodes can be implemented as illustrated in FIG. 4 to provide a device with a lateral extent extending over multiple masks 408. Thus, high current flow devices can be implemented using embodiments of the present invention. In some applications, multiple contacts 403 are matched to a single contact 402 depending on the particular device geometry. Referring to FIG. 4, it should be noted that in some embodiments, the width of the contacts 403 is matched to the width of the high quality material above the masks 408. In some implementations, the width of the contacts 403 is slightly less than the width of the high quality material.

FIG. 5 is a simplified schematic diagram illustrating a p-n junction diode with reduced defects according to an embodiment of the present invention. The GaN p-n junction diode 500 illustrated in FIG. 5 shares similar structures with the Schottky diode 400 illustrated in FIG. 4. The GaN p-n junction diode 500 includes regions with locally reduced TDD achieved using the ELO growth process and includes an n-type GaN layer 501, which may be a GaN substrate, a GaN epitaxial layer formed on a sapphire or other suitable substrate, or the like. An ohmic contact 502 is formed to the n-type GaN 502. Dielectric stripe-shaped ELO mask 508 is used to grow n-type GaN layer 511, which includes threading dislocations 509 which propagate from window regions of exposed GaN 512, coalescence boundary 510, and regions with low TDD with width 513 disposed over the ELO mask 508. A p-type doped GaN layer is deposited and patterned to form p-GaN regions 504, which have an ohmic contact 503 to the p-type GaN regions 504. A p-n junction 505 is formed between the n-type GaN epitaxial layer 511 and the p-type GaN regions 504 to provide the rectifying functions of the p-n junction diode. It should be noted that p-n junctions are only formed in the low TDD regions, with the threading dislocations 509 and the coalescence boundary 510 removed using, for example, an etching process. Thus, the p-n junctions are characterized by improved electrical characteristics such as reduced leakage and the like in comparison with p-n junctions that would have been formed in the areas that have been removed.

To benefit from the locally reduced TDD produced by the ELO process, the active device may be formed only in the low TDD region, as shown in cross section in FIGS. 4 and 5 for a Schottky barrier diode 400 and a p-n junction diode 500, respectively. By achieving a laterally varying dislocation distribution, performance and reliability benefits accrue from the locally low dislocation density in active regions of the device. Referring to FIGS. 4 and 5, the active device region under contact 403 and the p-n junctions 505 are formed in the regions with low dislocation densities. In other embodiments, the device active areas can be arranged such that the high-field regions (for example, at the edges of a Schottky barrier diode) are placed in the low dislocation density regions in order to suppress premature breakdown. Thus, depending on the particular application, a variety of device geometries can be utilized as appropriate to the particular application.

Figure 6:
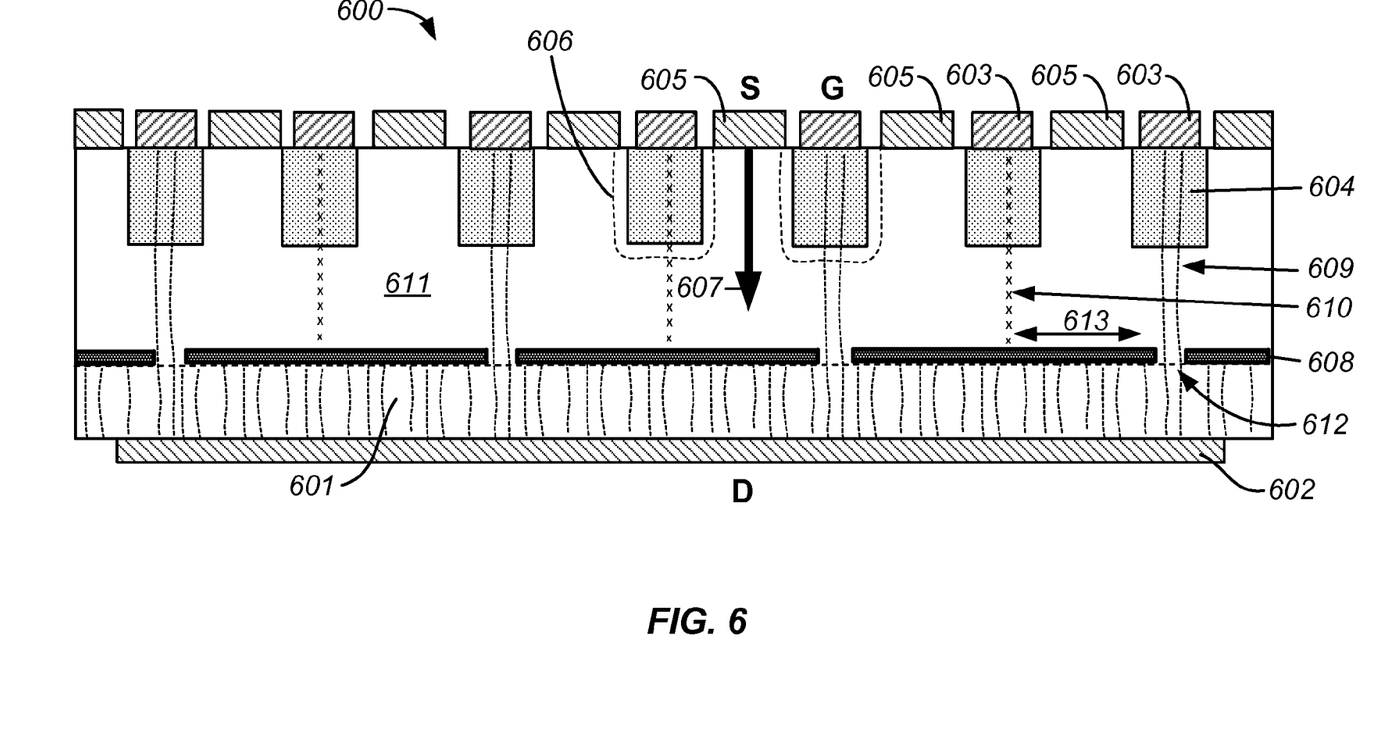
FIG. 6 is a simplified schematic diagram illustrating a vertical junction field effect transistor with reduced defects according to an embodiment of the present invention.

FIG. 6 is a simplified schematic diagram illustrating a vertical junction field effect transistor with reduced defects according to an embodiment of the present invention. As illustrated in FIG. 6, a GaN vertical JFET 600 is formed from GaN using an ELO process to provide locally low TDD regions. The GaN vertical JFET includes an n-type GaN substrate 601 and an ohmic contact 602 to the n-type GaN substrate to provide a drain contact D of the transistor. The GaN vertical JFET also includes a dielectric stripe-shaped ELO mask 608 and an n-type GaN epitaxial layer 611 including threading dislocations 609 that propagate from window region 612 and coalescence boundaries 610.

Stripe-shaped regions of p-type GaN regions 604 are formed in contact with (i.e., embedded in) the n-type GaN epitaxial layer 611 and electrode contacts 603 are formed to provide a gate contact G of the transistor. The p-type GaN regions can be formed by etch and regrowth or diffusion of an acceptor species into the n-type GaN layer. The transistor source contact S is formed using ohmic contacts 605. As illustrated in this embodiment, on the surface of the vertical JFET, the p-contact stripes 603 alternate with electrodes 605 that form ohmic contact to the n-type regions of the surface. Lateral p-n junctions are formed and the edge of the depletion regions are illustrated by reference numeral 606.

During operation, a bias is applied between the contacts 605 and the broad-area contact 602 (the source and drain of the transistor) and current flow vertically through the channels formed between the adjacent gates along direction 607. The regions of low TDD disposed over the ELO mask with width 613 provide a higher quality material than conventional structures, with improved electrical performance as a result. In the vertical JFET illustrated in FIG. 6, the vertical conduction is modulated by a bias applied to the array of lateral p-n junctions. The lateral p-n junctions formed between the gates and channels permit modulation of the current flow 607 by biasing the p-type electrodes 603 with respect to the n-type electrodes 605. Specifically, as reverse bias is applied across the lateral junctions, the depletion region 606 may be modulated. For a sufficient reverse bias, the current channel may be pinched off and therefore the current flow 307 becomes zero.

The lateral junctions of the vertical JFET 600 may be registered to the underlying ELO mask 608 and dislocation distribution 609, 610 as shown in FIG. 6. In the embodiment illustrated in FIG. 6, the source contact 605 is formed in the low TDD regions, while the gate contact 603 and the p-type regions 604 are formed in regions of higher dislocation density associated with threading dislocations 609 and the coalescence boundaries 610. This alignment ensures that the vertical transport and high fields are confined to the low TDD regions to achieve improved performance and reliability. However, it should be noted that the present invention is not limited to this particular geometry and p-n junctions can be formed in regions of higher dislocation density in other embodiments. Alternative registrations and particular dimensions of for the contact metals, the ELO mask, the window regions, and the like can be determined based on the particular application.

Figure 7:
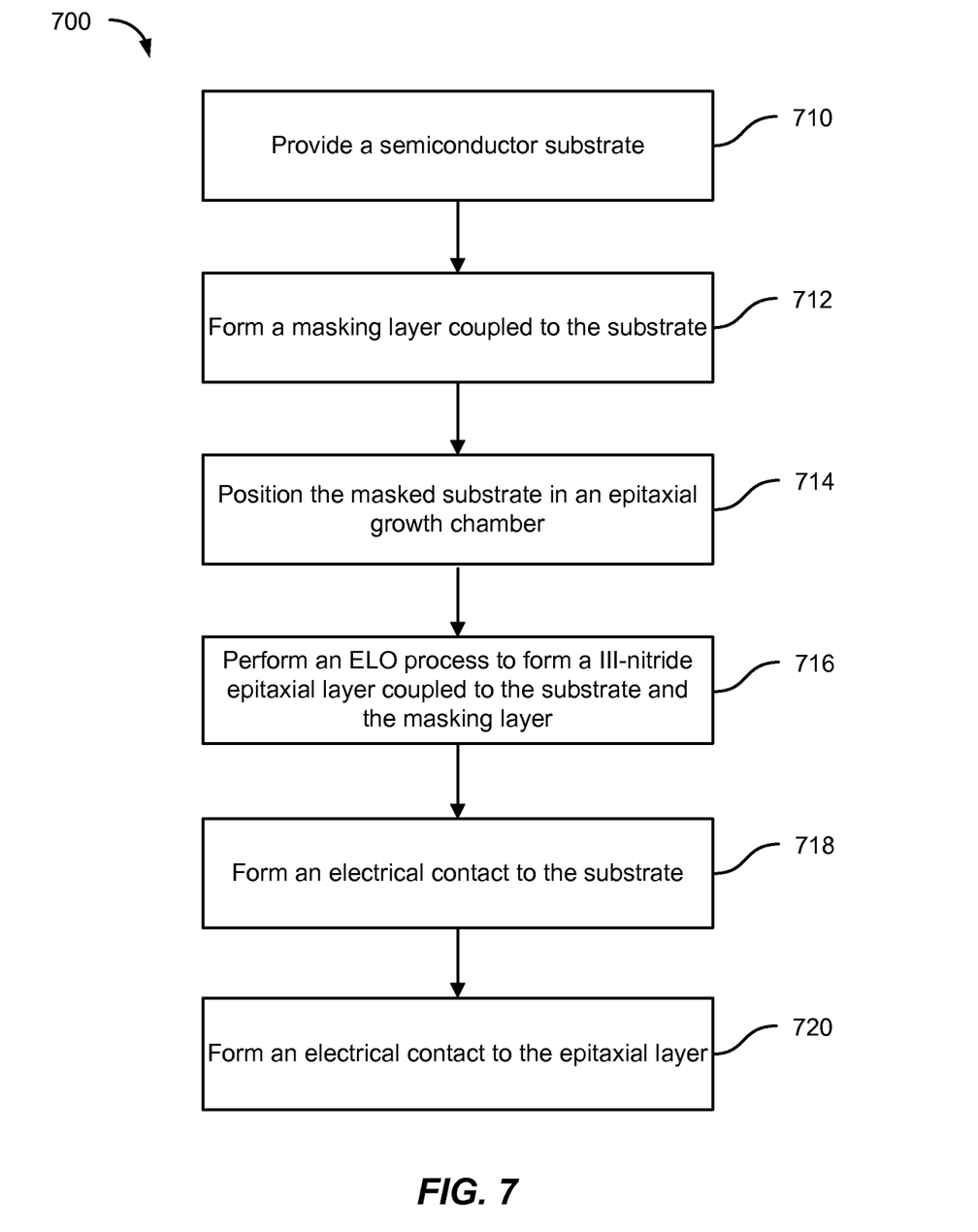
FIG. 7 is a simplified flowchart illustrating a method of fabricating an electronic structure with reduced defects according to an embodiment of the present invention.

FIG. 7 is a simplified flowchart illustrating a method of fabricating an electronic structure with reduced defects according to an embodiment of the present invention. The method 700 includes providing a semiconductor substrate 710. As an example, the semiconductor substrate can be an n-type GaN substrate characterized by a first defect density (e.g., a bulk GaN substrate with a dislocation density higher than $1 \times 10^5$ cm$^{-2}$). In other embodiments, the substrate is a GaN substrate with one or more epitaxial layers formed thereon, a sapphire substrate with one or more epitaxial layers (e.g., III-nitride layers such as n-type GaN) grown on the sapphire substrate. Thus, as discussed above, the term substrate is not intended to indicate a single material, but can include one or more materials, buffer layers, epitaxial layers, and the like.

The method also includes forming a masking layer coupled to the substrate (712). The masking layer includes continuous portions and openings exposing the substrate. As an example, an SiO$_2$ layer (or other oxides) or an Si$_3$N$_4$ (or other nitrides) can be deposited and patterned to define the continuous portions of the mask and portions where the masking layer is removed to expose the substrate. In some embodiments, the openings are defined to provide nucleation regions for ELO processes in which the ELO epitaxial layer nucleates on the substrate and then grows laterally over the continuous portions of the masking layer. In some embodiments, adhesion layers, buffer layers, or the like, are deposited prior to the deposition of the masking layer or after patterning to provide for high quality crystal growth during the ELO process.

The method further includes positioning the masked substrate in an epitaxial growth chamber (714) and performing an epitaxial lateral overgrowth process to form a III-nitride epitaxial layer coupled to the substrate and the masking layer (716). Additionally, the method includes forming an electrical contact electrically connected to the substrate (718) and forming an electrical contact electrically connected to the III-nitride epitaxial layer (720). In some embodiments, the III-nitride epitaxial layer includes a region disposed over the openings that is characterized by a dislocation density substantially equal to the dislocation density of the substrate. The III-nitride epitaxial layer also includes a plurality of regions characterized by a dislocation density less than the dislocation density of the substrate.

In one embodiment, the method 700 illustrated in FIG. 7 is used to fabricate a Schottky barrier diode. In some implementations of this embodiment, the electrical contact electrically connected to the III-nitride epitaxial layer overlies the continuous portions of the masking layer (see FIG. 4). In other embodiments, the electrical contact electrically connected to the III-nitride epitaxial layer overlies either the threading dislocations 409 or the coalescence boundary 410. One of ordinary skill in the art would recognize many variations, modifications, and alternatives.

In another embodiment, the method 700 illustrated in FIG. 7 is used to fabricate a p-n junction diode. In some implementations of this embodiment, the III-nitride epitaxial layer has a first conductivity type (e.g., n-type) and the method further includes forming a second III-nitride epitaxial layer having a second conductivity type (e.g., p-type) opposite to the first conductivity type in order to form the p-n junction. The second III-nitride epitaxial layer is disposed between the III-nitride epitaxial layer and the electrical contact electrically connected to the III-nitride epitaxial layer as illustrated in FIG. 5. As shown in FIG. 5, in some implementations of this embodiment, the electrical contact electrically connected to the III-nitride epitaxial layer (connected through the second III-nitride epitaxial layer) overlies the continuous portions of the masking layer. In other embodiments, the electrical contact electrically connected to the III-nitride epitaxial layer overlies either the threading dislocations 509 or the coalescence boundary 510. One of ordinary skill in the art would recognize many variations, modifications, and alternatives.

In yet another embodiment, the method 700 illustrated in FIG. 7 is used to fabricate a vertical JFET. As an example, the vertical JFET illustrated in FIG. 6 can be fabricated by forming a plurality of gate regions coupled to the III-nitride epitaxial layer. The plurality of gate regions define one or more current flow channels in the epitaxial layer. As illustrated in FIG. 5, the electrical contact electrically connected to the III-nitride epitaxial layer (e.g., via the epitaxial layer 504) overlies the continuous portions of the masking layer to utilize the high quality material formed in these regions during the ELO process.

In some embodiments, the epitaxial layers grown using the techniques described herein are suitable for use in fabricating high power electrical devices. These high power devices can support high current flow, high voltages, or combinations thereof. For such device, the dopant concentration and drift layer thickness ($t_{drift}$) (i.e., depletion width) as a function of breakdown voltage can be computed. Thus, the techniques described herein can be used to fabricate devices with epitaxial layers (e.g., drift layers) greater than or equal to 3.7 μm in thickness. Table 1 lists doping concentrations and depletion widths of the drift region for breakdown voltages from 600 V to 13.6 kV. The layer thicknesses illustrated in Table 1 are suitable for fabrication using the techniques described herein. Additional discussion related to epitaxial layer thicknesses is provided in U.S. patent application Ser. No. 13/198,661, filed on Aug. 4, 2011, the disclosure of which is hereby incorporated by reference in its entirety.

TABLE 1

| $V_{BR}$ (V) | Doping Concentration (cm$^{-3}$) | $t_{drift}$ (μm) |
| --- | --- | --- |
| 600 | 4.75E+16 | 3.7 |
| 1200 | 2.38E+16 | 7.3 |
| 1800 | 1.59E+16 | 10.9 |
| 2400 | 1.19E+16 | 14.6 |
| 3200 | 8.94E+15 | 19.4 |
| 4000 | 7.16E+15 | 24.2 |
| 4800 | 5.96E+15 | 29.1 |
| 5600 | 5.10E+15 | 34.0 |
| 6400 | 4.47E+15 | 38.8 |
| 7200 | 3.97E+15 | 43.7 |
| 8000 | 3.58E+15 | 48.5 |
| 8800 | 3.25E+15 | 53.4 |
| 9600 | 2.92E+15 | 59.4 |
| 10400 | 2.75E+15 | 63.1 |
| 11200 | 2.56E+15 | 67.9 |
| 12000 | 2.38E+15 | 72.8 |
| 12800 | 2.24E+15 | 77.6 |
| 13600 | 2.10E+15 | 82.5 |

As illustrated in Table 1, some embodiments utilize an epitaxial layer ranging in thickness from 3.7 μm to 82.5 μm. These thicknesses are only exemplary and other thicknesses are included within the scope of the present invention. As an example, some embodiments utilize an epitaxial layer between 10 μm and 100 μm in thickness, between 25 μm and 75 μm in thickness, or between 40 μm and 60 μm in thickness. In a particular embodiment, the thickness of the epitaxial layer is greater than 5 μm as suitable for high power operation. The thickness can range from 5 μm to 100 μm, for example from 10 μm to 50 μm. One of ordinary skill in the art would recognize many variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A diode comprising:
   a substrate characterized by a first dislocation density and a first conductivity type;
   a first contact coupled to the substrate;
   a masking layer having a predetermined thickness and coupled to the semiconductor substrate, wherein the masking layer comprises a plurality of continuous sections and a plurality of openings exposing the substrate, wherein the openings are disposed between the continuous sections;
   an epitaxial layer greater than 5 μm thick coupled to the substrate and the masking layer, wherein the epitaxial layer comprises:
      a first set of regions overlying the plurality of openings and characterized by a second dislocation density; and
      a second set of regions overlying the set of continuous sections and characterized by a third dislocation density less than the first dislocation density and the second dislocation density; and
   a plurality of second contacts coupled to the epitaxial layer, wherein each of the second contacts overlies a continuous section of the masking layer, and wherein each continuous section of the masking layer is overlied by more than one second contact.

2. The diode of claim 1 wherein the substrate comprises a GaN substrate and the first dislocation density is higher than $1 \times 10^5$ cm$^{-2}$.

3. The diode of claim 1 wherein the first conductivity type comprises an n-type.

4. The diode of claim 1 wherein the epitaxial layer comprises one or more GaN-based layers.

5. The diode of claim 4 wherein the thickness of the epitaxial layer is between 10 μm and 100 μm.

6. The diode of claim 5 wherein the thickness of the epitaxial layer is between 20 μm and 50 μm.

7. The diode of claim 1 wherein the masking layer comprises a patterned oxide layer.

8. The diode of claim 1 wherein the plurality of openings are characterized by a lateral width of between 2 μm and 10 μm.

9. The diode of claim 1 wherein the second dislocation density is substantially equal to the first dislocation density.

10. The diode of claim 1 wherein the second contact overlies the second set of regions of the epitaxial layer.

11. The diode of claim 1 further comprising a coalescence boundary disposed in the second set of regions of the epitaxial layer.

12. The diode of claim 1 further comprising a second epitaxial layer of a second conductivity type opposite to the first conductivity type disposed between the epitaxial layer and the second contact.

13. The diode of claim 12 wherein the second contact comprises an ohmic contact.

14. The diode of claim 1 further wherein the second contact comprises a Schottky contact.

15. A vertical junction FET comprising:
- a substrate characterized by a first dislocation density and a first conductivity type;
- a first contact coupled to the substrate;
- a masking layer having a predetermined thickness and coupled to the semiconductor substrate, wherein the masking layer comprises a plurality of continuous sections of the predetermined thickness and a plurality of openings exposing the substrate, wherein the openings are disposed between the continuous sections;
- an epitaxial layer coupled to the substrate and the masking layer, wherein the epitaxial layer comprises:
  - a first set of regions overlying the plurality of openings and characterized by a second dislocation density; and
  - a second set of regions overlying the set of continuous sections and characterized by a third dislocation density less than the first dislocation density and the second dislocation density;
- a plurality of gate regions coupled to the epitaxial layer and defining one or more current flow channels;
- one or more second contacts coupled to the epitaxial layer, each of the one or more second contacts being adjacent one of the one or more current flow channels, wherein each of the second contacts overlies a corresponding one of the continuous sections of the masking layer, and wherein each continuous section of the masking layer is overlied by more than one second contact; and
- a plurality of third contacts, each of the plurality of third contacts being coupled to one of the plurality of gate regions.

16. The vertical junction FET of claim 15 wherein the substrate comprises a III-nitride substrate.

17. The vertical junction FET of claim 16 wherein the III-nitride substrate comprises an n-type GaN substrate and the first dislocation density is higher than $1 \times 10^5$ cm$^{-2}$.

18. The vertical junction FET of claim 15 wherein the masking layer comprises a patterned oxide layer.

19. The vertical junction FET of claim 15 wherein the plurality of openings are characterized by a lateral width of between 2 μm and 10 μm.

20. The vertical junction FET of claim 15 wherein the second dislocation density is substantially equal to the first dislocation density.

21. The vertical junction FET of claim 15 wherein each of the one or more current flow channels are disposed between sets of the plurality of gate regions and the one or more second contacts overlie the one or more current flow channels.

22. The vertical junction FET of claim 15 wherein the first contact comprises a drain, the one or more second contacts comprise sources, and the plurality of third contacts comprise gates.

23. The vertical junction FET of claim 15 further comprising a regrowth interface between the plurality of gate regions and the epitaxial layer.

* * * * *